(12) United States Patent
Lee et al.

(10) Patent No.: US 11,563,047 B2
(45) Date of Patent: Jan. 24, 2023

(54) IMAGE SENSING MODULE

(71) Applicant: Powerchip Semiconductor Manufacturing Corporation, Hsinchu (TW)

(72) Inventors: Shih-Ping Lee, Hsinchu (TW); Wen-Hsien Chen, Taichung (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 273 days.

(21) Appl. No.: 16/898,412

(22) Filed: Jun. 10, 2020

(65) Prior Publication Data

US 2021/0335872 A1   Oct. 28, 2021

(30) Foreign Application Priority Data

Apr. 24, 2020   (TW) ................................ 10911379.6

(51) Int. Cl.
*H01L 27/146* (2006.01)

(52) U.S. Cl.
CPC .. *H01L 27/14625* (2013.01); *H01L 27/14629* (2013.01)

(58) Field of Classification Search
CPC ......... H01L 27/14625; H01L 27/14629; H01L 27/1463; H01L 27/14621
See application file for complete search history.

(56) References Cited

U.S. PATENT DOCUMENTS

| 7,964,840 B2 | 6/2011 | Parks |
| 9,064,763 B2 | 6/2015 | Ozawa et al. |
| 9,601,534 B2 | 3/2017 | Sekine |
| 2008/0170143 A1 | 7/2008 | Yoshida |

(Continued)

FOREIGN PATENT DOCUMENTS

| CN | 109580182 | 4/2019 |
| JP | S59134840 | 8/1984 |
| JP | 2000352697 | 12/2000 |

(Continued)

OTHER PUBLICATIONS

"Office Action of Taiwan Counterpart Application," dated Dec. 9, 2020, p. 1-p. 4.

(Continued)

*Primary Examiner* — Julia Slutsker
(74) *Attorney, Agent, or Firm* — JCIPRNET

(57) ABSTRACT

The present disclosure provides an image sensing module including a main board and an image sensor. The main board has a first surface and a second surface opposite to each other. The image sensor is disposed on the first surface of the main board and includes a plurality of isolation structures and a photoelectric conversion element between the plurality of isolation structures. A first angle is provided between a light incident surface of the photoelectric conversion element and the first surface of the main board, and a second angle is provided between a light beam incident to the light incident surface of the photoelectric conversion element and a normal vector of the light incident surface. The second angle is about equal to the Brewster angle at the interface of the light beam incident to the light incident surface.

4 Claims, 4 Drawing Sheets

(56) References Cited

U.S. PATENT DOCUMENTS

2019/0157332 A1* 5/2019 Long .................. H01L 27/1462

FOREIGN PATENT DOCUMENTS

| | | |
|---|---|---|
| JP | 3139023 | 2/2001 |
| TW | 200811613 | 3/2008 |
| TW | 201012204 | 3/2010 |
| TW | 201218364 | 5/2012 |
| TW | 201834020 | 9/2018 |
| TW | 201923478 | 6/2019 |

OTHER PUBLICATIONS

Tomohiro Yamazaki, et al.,"Four-Directional Pixel-Wise Polarization CMOS Image Sensor Using Air-Gap Wire Grid on 2.5-μm Back-Illuminated Pixels", 2016 IEEE International Electron Devices Meeting (IEDM), Dec. 3-7, 2016, pp. 8.7.1-8.7.4.

* cited by examiner

IMAGE SENSING MODULE

CROSS-REFERENCE TO RELATED APPLICATION

This application claims the priority benefits of Taiwan application serial no. 109113796, filed on Apr. 24, 2020. The entirety of the above-mentioned patent application is hereby incorporated by reference herein and made a part of this specification.

BACKGROUND OF THE INVENTION

1. Field of the Invention

The invention relates to a sensing module, and more particularly, to an image sensing module.

2. Description of Related Art

With the development and growth of the products such as digital cameras and electric scanners, the requirement in the market for image sensing elements are increased continuously. Presently, the commonly used image sensing elements include two major categories: a charge coupled device (CCD) and a CMOS image sensor (CIS), wherein the CMOS image sensor has advantages of low operating voltage, low power consumption, and high operating efficiency and can be integrated into the current technology of semiconductor manufacturing processes, therefore the range of applications of the CMOS image sensor is broad.

However, the image sensing elements are easy to be affected by the ambient light. For example, when an object to be shot is located in a medium (such as water) with partial reflection and partial transmission characteristics, the image sensing elements not only collects the light reflected from the object, but also collects the light reflected from the surface of the medium (undesired reflected light). As such, the photograph may include an image reflected from the surface of the medium and thereby cause interference, especially, in the case where the ambient light is strong, the photograph may present the image reflected from the surface of the medium rather than the image reflected from the object, thereby the object in the medium cannot be photographed.

SUMMARY OF THE INVENTION

The invention provides an image sensing module that can avoid the interference from the undesired reflected light.

An embodiment of the invention provides an image sensing module including a main board and an image sensor. The main board has a first surface and a second surface opposite to each other. The image sensor is disposed on the first surface of the main board and includes a plurality of isolation structures and a photoelectric conversion element between the plurality of isolation structures. A first angle is provided between a light incident surface of the photoelectric conversion element and the first surface of the main board, and a second angle is provided between a light beam incident to the light incident surface of the photoelectric conversion element and a normal vector of the light incident surface. The second angle is about equal to the Brewster angle at the interface of the light beam incident to the light incident surface.

According to an embodiment of the invention, the image sensor includes a dielectric layer disposed on the light incident surface of the photoelectric conversion element and the plurality of the isolation structures.

According to an embodiment of the invention, the image sensor includes a plurality of light reflective structures disposed in the dielectric layer and spaced apart from each other.

According to an embodiment of the invention, the plurality of light reflective structures are disposed on the light incident surface of the photoelectric conversion element and the plurality of the isolation structures.

Another embodiment of the invention provides an image sensing module including a main board, an image sensor, and a light guide element. The image sensor is disposed on the main board and includes a plurality of isolation structures and a photoelectric conversion element between the plurality of isolation structures. The light guide element is disposed on the image sensor. An angle between a light beam passed through the light guide element and incident to a light incident surface of the photoelectric conversion element and a normal vector of the light incident surface is about equal to the Brewster angle at the interface of the light beam incident to the light incident surface.

According to an embodiment of the invention, the image sensor includes a dielectric layer disposed on the light incident surface of the photoelectric conversion element and the plurality of the isolation structures.

According to an embodiment of the invention, the image sensor includes a plurality of light reflective structures disposed in the dielectric layer and spaced apart from each other.

According to an embodiment of the invention, the plurality of light reflective structures are disposed on the light incident surface of the photoelectric conversion element and the plurality of the isolation structures.

Still another embodiment of the invention provides an image sensing module including a main board and an image sensor. The image sensor is disposed on the main board and includes a plurality of isolation structures, a photoelectric conversion element, and a plurality of light reflective structures. The photoelectric conversion element is disposed between the plurality of isolation structures. The plurality of light reflective structures is disposed on a light incident surface of the photoelectric conversion element and the plurality of the isolation structures and spaced apart from each other. An angle between a light beam reflected by the plurality of light reflective structures and incident to the light incident surface of the photoelectric conversion element and a normal vector of the light incident surface is about equal to the Brewster angle at the interface of the light beam incident to the light incident surface.

Based on the above, due to the angle between the light beam incident to the light incident surface of the photoelectric conversion element and a normal vector of the light incident surface is about equal to the Brewster angle at the interface of the light beam incident to the light incident surface, a portion of the light reflected from the surface of the medium will be reflected at the light incident surface, so that the light intensity collected by the photoelectric conversion element from the light reflected from the surface of the medium can be reduced to avoid the interference caused by the undesired reflected light.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated

DESCRIPTION OF THE EMBODIMENTS

Figure 1:
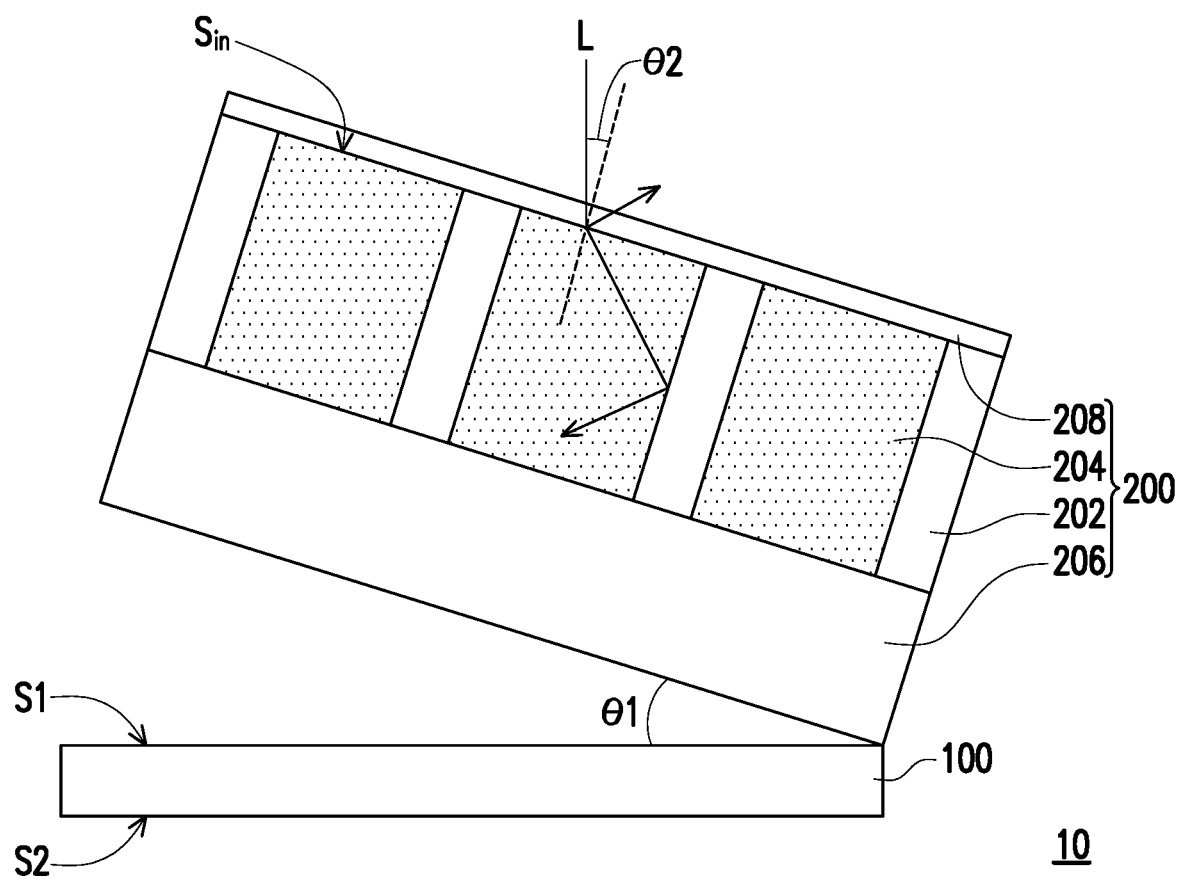
FIG. 1 is a cross-sectional view of the image sensing module in an embodiment of the invention.

The present disclosure is more fully described with reference to the drawings of the embodiments. However, the present disclosure may be embodied in a variety of different forms and should not be limited to the embodiments described herein. The thickness of layers and regions in the drawings will be exaggerated for clarity. The same or similar reference numerals indicate the same or similar elements, and the following paragraphs will not be repeated.

It will be understood that when an element is referred to as being "on" or "connected" to another element, it may be directly on or connected to the other element or intervening elements may be present therebetween. If an element is referred to as being "directly on" or "directly connected" to another element, there are no intervening elements therebetween. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection). For example, the electrical connection may include a general connection of wired connection as described above, or an interface connection through MIPI.

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within ±5%. Furthermore, "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

FIG. 1 is a cross-sectional view of the image sensing module in an embodiment of the invention.

Referring to FIG. 1, an image sensing module 10 may include a main board 100 and an image sensor 200. In the present embodiment, the main board 100 may be electrically connected with the image sensor 200 and may have a first surface S1 and a second surface S2 opposite to each other. In some embodiments, the main board 100 may be a circuit board, such as printed circuit board (PCB).

The image sensor 200 may be disposed on the first surface S1 of the main board 100 and may include a plurality of isolation structures 202 and a photoelectric conversion element 204 between the plurality of isolation structure 202. In the present embodiment, the photoelectric conversion element 204 may include a photodiode, that is the photoelectric conversion element 204 may be constituted by two doped regions (not illustrated) with conductive types opposite to each other. For example, one of the two doped regions may be an n-type doped region, and the other one of the two doped regions may be a p-type doped region. In the present embodiment, the isolation structure 202 may be deep trench isolation structure (DTI). In the present embodiment, the image sensor 200 may include a dielectric layer 206, wherein the dielectric layer 206 may include active elements (e.g., PMOS, NMOS, or CMOS), interlayer dielectric layers and/or contacts, intermetal dielectric layers, and conductive patterns of multi-metal interconnection and/or vias. However, in order to more clearly describe the configuration and/or structure of the present invention, these elements are not shown in the drawings. In the present embodiment, the image sensor 200 may be a CMOS image sensor, such as a back-side illuminated (BSI) CMOS image sensor or a front-side illuminated (FSI) CMOS image sensor, a charge-coupled device (CCD), and the like. Although the image sensor 200 shown in FIG. 1 is a BSI CMOS image sensor, the invention is not limited thereto because it is used as an exemplary embodiment to clearly describe the invention. For example, the image sensor 200 may be a FSI CMOS image sensor in other embodiments.

There is a first angle θ1 between the image sensor 200 and the first surface S1 of the main board 100, so that the first angle θ1 is provided between the light incident surface $S_{in}$ of the photoelectric conversion element 204 and the main board 100, thereby a second angle θ2 is provided between a light beam L incident to the light incident surface $S_{in}$ of the photoelectric conversion element 204 and a normal vector of the of the light incident surface $S_{in}$, and the second angle θ2 is about equal to the Brewster angle at the interface of the light beam L incident to the light incident surface. As such, a portion of the light reflected from a surface of a medium will be reflected at the light incident surface $S_{in}$, so that the light intensity collected by the photoelectric conversion element 204 from the light reflected from the surface of the medium can be reduced to avoid the interference caused by the undesired reflected light. For example, when a natural light is reflected and refracted at the interface between two different mediums, the polarization state of the reflected and refracted light will also be changed and no longer be the natural light. Namely, a light vibration perpendicular to an incident surface such as a s-polarized light or a transverse-electric light (TE) is larger than a light vibration parallel to the incident surface such as a p-polarized light or a transverse-magnetic light (TM) in the reflected light, and the light vibration perpendicular to an incident surface is smaller than the light vibration parallel to the incident surface in the refracted light, which is opposite to the reflected light. Accordingly, when the light beam L is incident to the light incident surface $S_{in}$ of the photoelectric conversion element 204 at Brewster angle, a portion of the linear polarized light perpendicular to the incident surface (i.e., a light reflected from the interface between two different mediums) will not be collected by the photoelectric conversion element 204 but reflected at the interface of the light incident surface $S_{in}$, and thereby significantly reducing the intensity of the undesired reflected light collected by the photoelectric conversion element 204. The first angle θ1 may be adjusted according to the difference in refractive index between two mediums, the wavelength of the incident light, films with other different material covered on the light incident surface $S_{in}$, and the like, as long as the light beam L is incident to the light incident surface $S_{in}$ of the photoelectric conversion element 204 at Brewster angle. For example, under the following circumstance: the wavelength of the light beam L is 1200 nm; the material of the photoelectric conversion element 204 is Si; and the light incident surface $S_{in}$ of the photoelectric conversion element 204 is directly in contact with the air, the Brewster angle is about 74.9 degree. As such, the first angle θ1 can be set at about 74.9 degree to avoid the interference caused by the undesired reflected light, wherein the above first angle θ1 has a good effect within the variation of 74.9±5 degree.

In some embodiments, the image sensor 200 may include a dielectric layer 208 disposed on the light incident surface of the photoelectric conversion element 204 and the plurality of isolation structures 202. A material of the dielectric layer 208 may be a high-dielectric constant material (high K). For example, the dielectric layer 208 may be SiN, $Ta_2O_5$, $TiO_2$, or $HfO_2$. In some other embodiments, the image sensing module 10 may also include a color conversion element (not illustrated) disposed on the light incident surface of the photoelectric conversion element 204 and the plurality of isolation structures 202. For example, the color conversion element may be a color filter (CF). The following Table 1 shows the Brewster angle at the interface between the photoelectric conversion element 204 and the various mediums. For example, the silicon (Si) is used as the exemplary material of the photoelectric conversion element 204 to calculate the Brewster angle at the interface between the photoelectric conversion element 204 and the various mediums such as air or films covered on the photoelectric conversion element 204 (e.g., color filter (CF) and the dielectric layer 208 with different kinds of materials), wherein the wavelength of the light is 633 nm.

TABLE 1

| | Refractive index of the medium | Refractive index of the photoelectric conversion element | Brewster angle |
|---|---|---|---|
| Air to Si | 1 | 3.67 | 74.7 |
| CF to Si | 1.6 | 3.67 | 66.4 |
| SiN to Si | 2 | 3.67 | 61.4 |
| $TiO_2$ to Si | 2.16 | 3.67 | 59.5 |
| $Ta_2O_5$ to Si | 2.58 | 3.67 | 54.9 |
| $HfO_2$ to Si | 2.11 | 3.67 | 60 |

Figure 2:
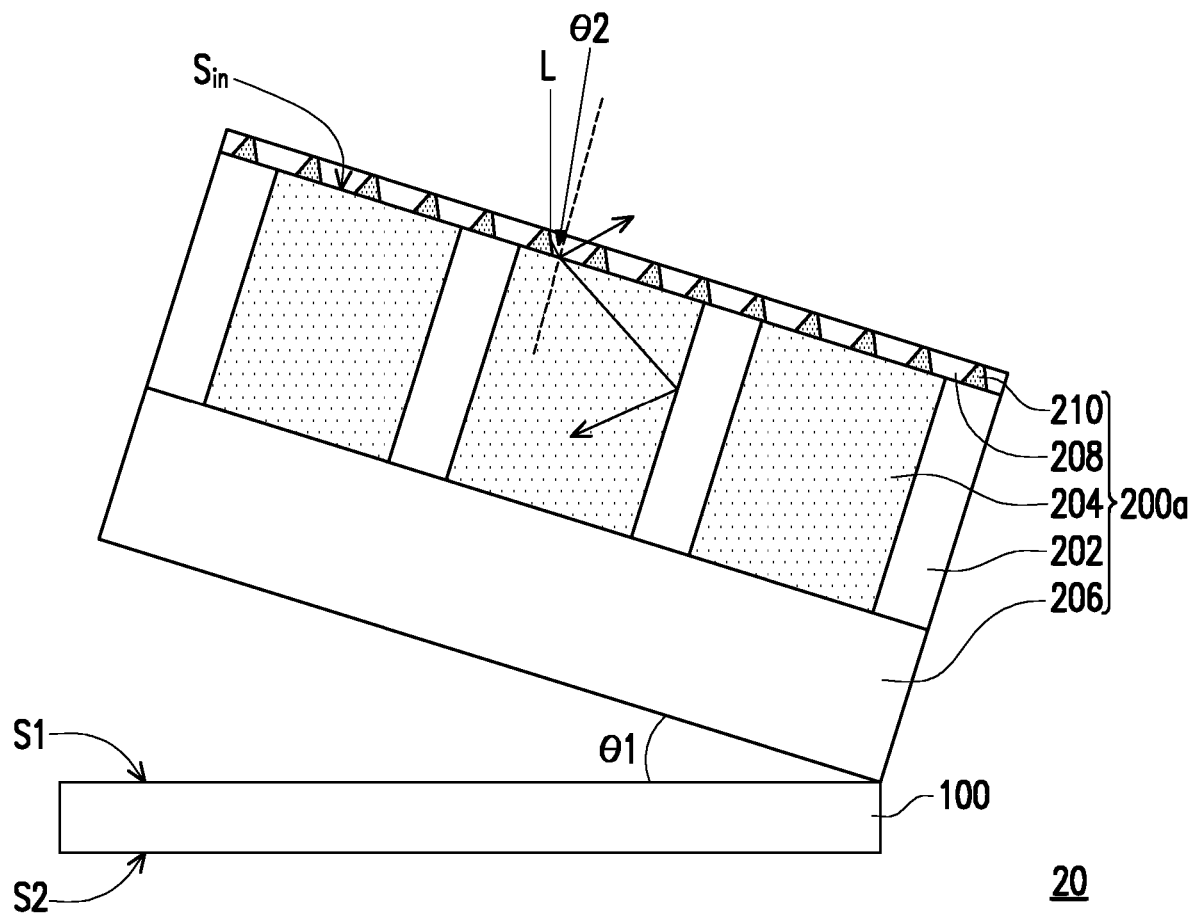
FIG. 2 is a cross-sectional view of the image sensing module in another embodiment of the invention.

FIG. 2 is a cross-sectional view of the image sensing module in another embodiment of the invention. An image sensing module 20 shown in FIG. 2 is generally the same as the image sensing module 10 shown in FIG. 1, the difference between the image sensing module 20 and the image sensing module 10 is that the image sensor 200a of the image sensing module 20 further includes a plurality of reflective structures 210. The connection relationships, materials, and manufacturing processes of the other components in the image sensing module 20 have been described in detail in the previous section, so the same or similar components use the same or similar reference numerals, and the descriptions thereof are omitted below.

Referring to FIG. 2, the image sensor 200a may include the plurality of reflective structures 210 disposed in the dielectric layer 208 and spaced apart from each other. As such, the angle of the light beam L incident to the light incident surface $S_{in}$ of the photoelectric conversion element 204 can be adjusted by the plurality of reflective structures 210 and the first angle θ1 between the image sensor 200a and the main board 100, so that the second angle θ2 provided between the light beam L incident to the light incident surface $S_{in}$ of the photoelectric conversion element 204 and the normal vector of the light incident surface $S_{in}$ is about equal to the Brewster angle at the interface of the light incident surface $S_{in}$. In the present embodiment, the plurality of reflective structures 210 may be spaced apart from each other and disposed on the light incident surface $S_{in}$ of the photoelectric conversion element 204 and the plurality of isolation structures 202.

Figure 3:
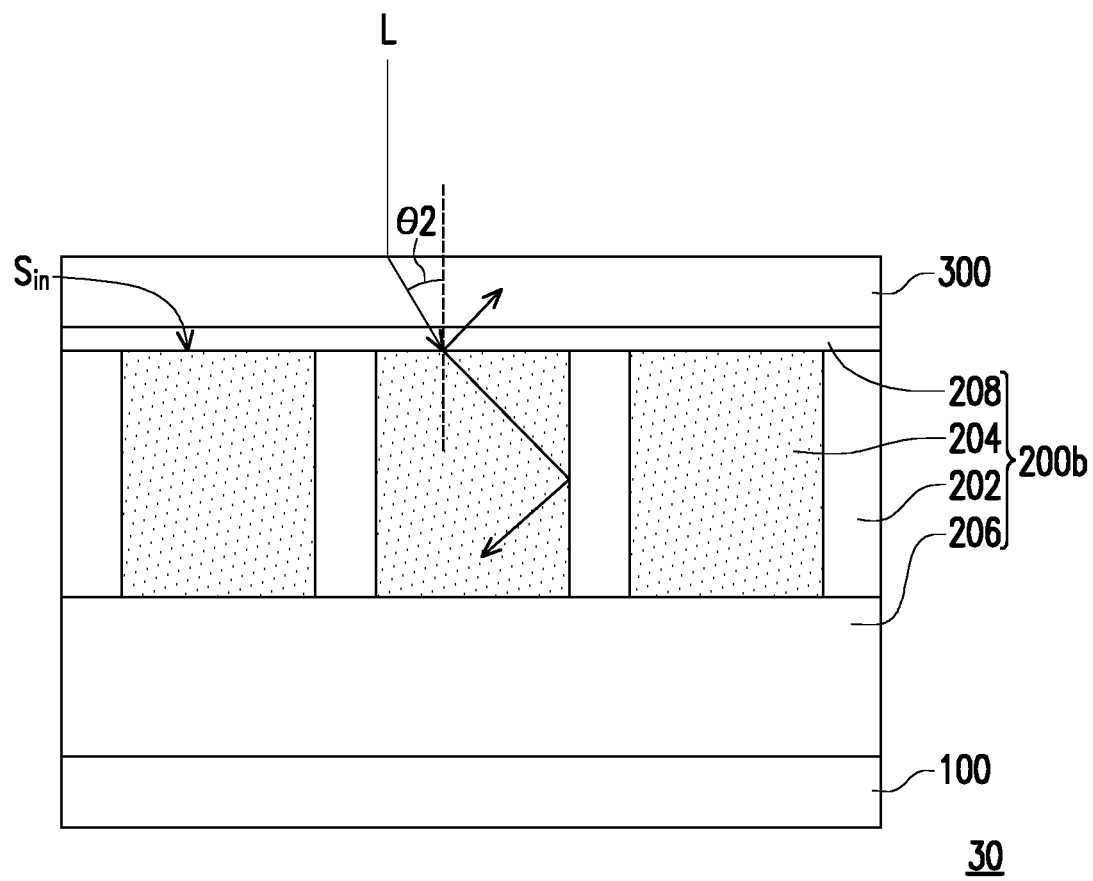
FIG. 3 is a cross-sectional view of the image sensing module in yet another embodiment of the invention.

FIG. 3 is a cross-sectional view of the image sensing module in yet another embodiment of the invention. An image sensing module 30 shown in FIG. 3 is generally the same as the image sensing module 10 shown in FIG. 1, the difference between the image sensing module 30 and the image sensing module 10 is that the first angle θ1 does not be provided between the image sensor 200b and the main board 100 in the image sensing module 30, and the image sensing module 30 further includes a light guide element 300. The connection relationships, materials and manufacturing processes of the other components in the image sensing module 30 have been described in detail in the previous section, so the same or similar components use the same or similar reference numerals, and the descriptions thereof are omitted below.

Referring to FIG. 3, the image sensing module 30 may include am image sensor 200b and a light guide element 300. The image sensor 200b may be disposed on the main board 100 and may include a plurality of isolation structures 202 and a photoelectric conversion element 204 between the plurality of isolation structures 202. The light guide element 300 may be disposed on the image sensor 200b, so that an angle θ2 is provided between a light beam L passed through the light guide element 300 and incident to the light incident surface $S_{in}$ of the photoelectric conversion element 204 and a normal vector of the light incident surface $S_{in}$ is about equal to the Brewster angle at the interface of the light beam L incident to the light incident surface $S_{in}$. As such, a portion of the light reflected from the surface of the medium will be reflected at the light incident surface, so that the light intensity collected by the photoelectric conversion element from the light reflected from the surface of the medium can be reduced to avoid the interference caused by the undesired reflected light. The light guide element 300 may be, for example, a microlens (not illustrated) having an asymmetric shape in order to change the direction of incident light with a large angle to reach the requirement of the Brewster angle. The light guide element 300 may also be an exterior module (not illustrated) such as reflecting mirrors or lens modules that is not directly in contact with the sensor, and the light may be incident to the sensor at the Brewster angle through the light guide element 300.

In some embodiments, an image sensor 200b may include a dielectric layer 208 disposed on the light incident surface of the photoelectric conversion element 204 and the plurality of isolation structures 202. A material of the dielectric layer 208 may be a high-dielectric constant material (high K). For example, the dielectric layer 208 may be SiN, $Ta_2O_5$, $TiO_2$, or $HfO_2$. In some other embodiments, the image sensing module 30 may also include a color conversion element (not illustrated) disposed on the light incident surface of the photoelectric conversion element 204 and the plurality of isolation structures 202. For example, the color conversion element may be a color filter (CF).

In some embodiments, the image sensor 200b may include the plurality of reflective structures 210 disposed in the dielectric layer 208 and spaced apart from each other. As such, the angle of the light beam L incident to the light incident surface $S_{in}$ of the photoelectric conversion element 204 can be adjusted by the plurality of reflective structures 210 and the light guide element 300, so that the angle θ2 provided between the light beam L incident to the light incident surface $S_{in}$ of the photoelectric conversion element 204 and the normal vector of the light incident surface $S_{in}$ is about equal to the Brewster angle at the interface of the light incident surface $S_{in}$. In the present embodiment, the plurality of reflective structures 210 may be spaced apart from each other and disposed on the light incident surface $S_{in}$ of the photoelectric conversion element 204 and the plurality of isolation structures 202.

Figure 4:
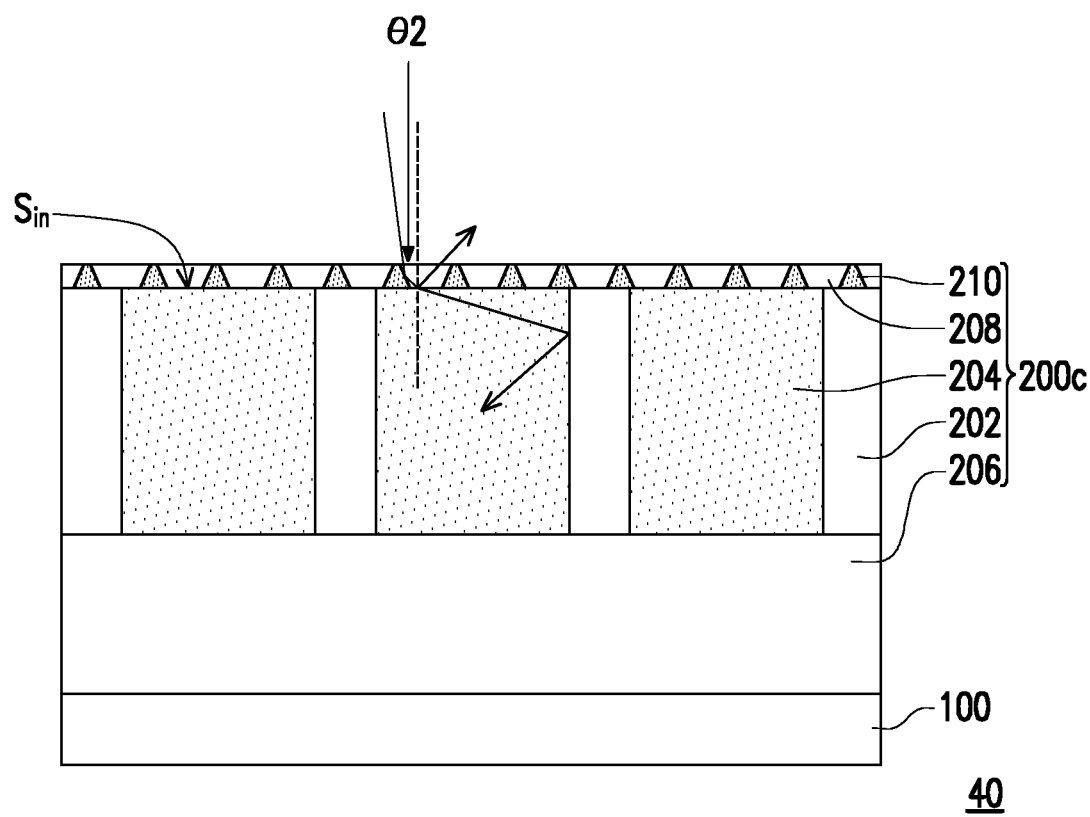
FIG. 4 is a cross-sectional view of the image sensing module in still another embodiment of the invention.

FIG. 4 is a cross-sectional view of the image sensing module in yet another embodiment of the invention. An image sensing module 40 shown in FIG. 4 is generally the same as the image sensing module 10 shown in FIG. 1, the difference between the image sensing module 40 and the image sensing module 10 is that the first angle θ1 does not be provided between the image sensor 200c and the main board 100 in the image sensing module 40, and the image sensing module 40 further includes a plurality of reflective structures 210. The connection relationships, materials and manufacturing processes of the other components in the image sensing module 40 have been described in detail in the previous section, so the same or similar components use the same or similar reference numerals, and the descriptions thereof are omitted below.

Referring to FIG. 4, the image sensing module 40 may include an image sensor 200c disposed on the main board 100. The image sensor 200c may include a plurality of isolation structures 202, a photoelectric conversion element 204 between the plurality of isolation structures 202, and a plurality of reflective structures 210 disposed on the light incident surface $S_{in}$ of the photoelectric conversion element 204 and the plurality of isolation structures 202 and spaced apart from each other. As such, the angle θ2 provided between the light beam L reflected by the plurality of reflective structures 210 and incident to the light incident surface $S_{in}$ of the photoelectric conversion element 204 and the normal vector of the light incident surface $S_{in}$ is about equal to the Brewster angle at the interface of the light incident surface $S_{in}$. Accordingly, a portion of the light reflected from the surface of the medium will be reflected at the light incident surface $S_{in}$, so that the light intensity collected by the photoelectric conversion element 204 from the light reflected from the surface of the medium can be reduced to avoid the interference caused by the undesired reflected light.

In summary, in the image sensing module of the above embodiments, due to the angle between the light beam incident to the light incident surface of the photoelectric conversion element and a normal vector of the light incident surface is about equal to the Brewster angle at the interface of the light beam incident to the light incident surface, a portion of the light reflected from the surface of the medium will be reflected at the light incident surface, so that the light intensity collected by the photoelectric conversion element from the light reflected from the surface of the medium can be reduced to avoid the interference caused by the undesired reflected light.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An image sensing module, comprising:
a main board having a first surface and a second surface opposite to each other; and
an image sensor disposed on the first surface of the main board, and comprising a plurality of isolation structures and a photoelectric conversion element between the plurality of isolation structures,
wherein a first angle is provided between a light incident surface of the photoelectric conversion element and the first surface of the main board, and a second angle is provided between a light beam incident to the light incident surface of the photoelectric conversion element and a normal vector of the light incident surface,
the first angle is an acute angle larger than 0, and
the first angle is configured to make the second angle being about equal to the Brewster angle at the interface of the light beam incident to the light incident surface.

2. The image sensing module according to claim 1, wherein the image sensor comprises a dielectric layer disposed on the light incident surface of the photoelectric conversion element and the plurality of the isolation structures.

3. The image sensing module according to claim 2, wherein the image sensor comprises a plurality of light reflective structures disposed in the dielectric layer and spaced apart from each other.

4. The image sensing module according to claim 3, wherein the plurality of light reflective structures are disposed on the light incident surface of the photoelectric conversion element and the plurality of the isolation structures.

* * * * *